United States Patent
Ochi et al.

(10) Patent No.: US 11,437,968 B2
(45) Date of Patent: Sep. 6, 2022

(54) GUITAR AMPLIFIER AND CONTROL METHOD OF GUITAR AMPLIFIER

(71) Applicant: Roland Corporation, Shizuoka (JP)

(72) Inventors: Toshiyuki Ochi, Shizuoka (JP); Yoshinobu Morimoto, Shizuoka (JP); Kosuke Takada, Shizuoka (JP)

(73) Assignee: Roland Corporation, Shizuoka (JP)

( * ) Notice: Subject to any disclaimer, the term of this patent is extended or adjusted under 35 U.S.C. 154(b) by 0 days.

(21) Appl. No.: 17/131,779

(22) Filed: Dec. 23, 2020

(65) Prior Publication Data

US 2021/0203294 A1 Jul. 1, 2021

(30) Foreign Application Priority Data

Dec. 27, 2019 (JP) .............................. JP2019-239934
Jan. 14, 2020 (JP) .............................. JP2020-003847

(51) Int. Cl.
*G10H 1/00* (2006.01)
*H03G 3/30* (2006.01)
*G06F 3/16* (2006.01)
*H04R 3/00* (2006.01)

(52) U.S. Cl.
CPC ............. *H03G 3/301* (2013.01); *G06F 3/165* (2013.01); *H04R 3/00* (2013.01); *H03G 2201/103* (2013.01)

(58) Field of Classification Search
CPC ...................................................... G10H 1/00
See application file for complete search history.

(56) References Cited

U.S. PATENT DOCUMENTS 7,915,514 B1 * 3/2011 Shrem ...................... G10H 1/02
 84/645
10,115,379 B1 * 10/2018 Juszkiewicz ............. G10H 1/46
(Continued)

FOREIGN PATENT DOCUMENTS

JP H0934460 2/1997
JP 2008511029 4/2008
(Continued)

OTHER PUBLICATIONS

"Search Report of Europe Counterpart Application", dated May 25, 2021, p. 1-p. 9.
(Continued)

*Primary Examiner* — Olisa Anwah
(74) *Attorney, Agent, or Firm* — JCIPRNET (57) ABSTRACT

A guitar amplifier and a control method of a guitar amplifier in which a setting of a performance mode can be easily changed without an interruption to a sound is provided. The guitar amplifier, which performs musical sound processing on an input musical sound and outputs it, includes a storage device which stores a plurality of information sets including a set value for each of one or two or more types of musical sound processing used in a performance mode, and a control device which changes the setting of the one or two or more types of musical sound processing to a setting according to a set value of a selected information set when information indicating ON of the performance mode, to which the selected information set from the plurality of information sets has been applied, is input.

18 Claims, 12 Drawing Sheets

(56) References Cited

U.S. PATENT DOCUMENTS

| | | | |
|---|---|---|---|
| 2009/0064850 A1* | 3/2009 | Lengeling | G10H 1/34 |
| | | | 84/634 |
| 2015/0332660 A1* | 11/2015 | Adams | G10H 3/18 |
| | | | 84/645 |
| 2018/0197512 A1 | 7/2018 | Perez | |
| 2020/0202826 A1* | 6/2020 | Nolan | G10H 3/186 |
| 2021/0043176 A1* | 2/2021 | Kaletta | G10H 1/348 |
| 2021/0074253 A1* | 3/2021 | Hochfield | G10H 3/182 |

FOREIGN PATENT DOCUMENTS

| | | |
|---|---|---|
| JP | 5308340 | 10/2013 |
| WO | 2019143363 | 7/2019 |

OTHER PUBLICATIONS

Rocktron Corporation, "Chameleon On-Line. Programmable 24-BIT DSP Guitar Preamp. User's Manual," Jan. 1997, Available at: http://www.manualnguide.com/dl/12586/.
Rocktron (Guitar Rack Technology), "All Access, User's Manual," Jan. 1994, Available at: http://www.manualnguide.com/dl/12552/.
"Office Action of Europe Counterpart Application", dated Jan. 21, 2022, p. 1-p. 6.

* cited by examiner

GUITAR AMPLIFIER AND CONTROL METHOD OF GUITAR AMPLIFIER

CROSS-REFERENCE TO RELATED APPLICATION

This application claims the priority benefits of Japan Patent Application No. 2019-239934, filed on Dec. 27, 2019, and Japan Patent Application No. 2020-003847, filed on Jan. 14, 2020. The entirety of each of the above-mentioned patent applications is hereby incorporated by reference herein and made a part of this specification.

BACKGROUND

Technical Field

The disclosure relates to a guitar amplifier and a control method of a guitar amplifier.

Description of Related Art

Conventionally, there is a guitar amplifier in which an effect setting can be switched by switching a channel with a foot switch (see, for example, Patent Document 1). Also, there is a guitar amplifier that includes at least one analog channel and an electronic memory that sets parameter values such as delay, reverberation, chorus, flanger, tremolo, treble, midrange, bass, channel volume, total volume, or the like so that storage of the parameter values of at least one channel can be automatically performed (see, for example, Patent Document 2). Patent Documents

[Patent Document 1] Japanese Patent No. 5308340
[Patent Document 2] Published Japanese Translation No. 2008-511029 of the PCT International Publication

SUMMARY

An objective of the disclosure is to provide a guitar amplifier in which a setting of a performance mode can be easily changed without an interruption to a sound.

One example of the disclosure is a guitar amplifier, which performs musical sound processing on an input musical sound and outputs it, including a storage device which stores a plurality of information sets including a set value for each of one or two or more types of musical sound processing used in a performance mode, and a control device which changes the setting of the one or two or more types of musical sound processing to a setting according to a set value of a selected information set when information indicating ON of the performance mode, to which the selected information set from the plurality of information sets has been applied, is input.

Also, an example of the disclosure may also include a control device of a guitar amplifier, a control method of a guitar amplifier, a program for controlling a guitar amplifier, and the like.

DESCRIPTION OF THE EMBODIMENTS

A guitar amplifier according to an embodiment is one that performs musical sound processing on an input musical sound and outputs it and can employ a configuration including the following.

(1) A storage device which stores a plurality of information sets including a set value for each of one or two or more types of musical sound processing used in a performance mode.

(2) A control device which changes the setting of the one or two or more types of musical sound processing to a setting according to a set value of a selected information set when information indicating ON of the performance mode, to which the selected information set from the plurality of information sets has been applied, is input.

According to the guitar amplifier of the embodiment, setting of the performance mode can be easily performed without an interruption to the sound. The performance mode may be, for example, a solo mode. In a performance of a band, when a guitarist plays a solo part, the guitarist may want to play the solo part in a state (setting) of a guitar amplifier which is different from that at the time of accompaniment. In the embodiment, a plurality of information sets including a set value for each of one or two or more types of musical sound processing used in a solo mode is stored, and thus a setting of the guitar amplifier can be easily changed to a setting of the solo mode. Also, a plurality of settings of the solo mode can be prepared.

The guitar amplifier according to the embodiment may employ a configuration in which the control device changes the setting of the one or two or more types of musical sound processing to a predetermined setting regardless of the set value of the selected information set when information indicating OFF of the performance mode is input.

The guitar amplifier according to the embodiment may employ a configuration in which the set value contained in the information set indicates whether or not the one or two or more types of musical sound processing are necessary. In this case, the guitar amplifier according to the embodiment may employ a configuration in which whether or not the one or two or more types of musical sound processing are necessary is one or more selected from whether or not utilizing a boost is necessary, whether or not changing a gain according to ON/OFF of the performance mode is necessary, whether or not utilizing an external device is necessary, whether or not adding effects using an effector is necessary, whether or not utilizing an equalizer is necessary, and whether or not changing a volume is necessary. However, whether or not the musical sound processing is necessary is not limited to the examples described above. Whether or not the musical sound processing is necessary may be, for example, ON or OFF of a musical sound processing circuit that performs each type of musical sound processing.

The guitar amplifier according to the embodiment may employ a configuration in which the control device performs fade processing at the time of switching a signal path of the musical sound processing according to switching of the information set applied to the performance mode. Thereby, an interruption to the sound and generation of abnormal noise due to switching of the signal path can be prevented.

The guitar amplifier according to the embodiment may employ a configuration in which the control device receives an input of information indicating selection of the same information set as a selected information set as information indicating ON or OFF of the performance mode to which the selected information set has been applied, and receives an input of information indicating selection of an information set different from the selected information set as a change instruction to select the different information set in a state in which any of the plurality of information sets has been selected. In this case, the guitar amplifier according to the embodiment may employ a configuration in which the control device changes the setting of the one or two or more types of musical sound processing used in the performance mode on the basis of a set value contained in the different information set when an input of information indicating selection of an information set different from the selected information set is received as a change instruction to select the different information set in a state in which any of the plurality of information sets has been selected.

The guitar amplifier according to the embodiment may employ a configuration in which the control device performs mute processing when the setting of the one or two or more types of musical sound processing is changed. Thereby, generation of abnormal noise can be prevented. The guitar amplifier according to the embodiment may employ a configuration in which the one or two or more types of musical sound processing are one or more arbitrarily selected from boosting, gaining, utilizing an external device, adding effects by an effector, equalizing, and changing a volume. However, types of musical sound processing are not limited to the examples described above. As the boosting, a plurality of types of boost processing having different operating characteristics may be prepared. Effects added by the effector are delay, tremolo, chorus, or the like, and types thereof do not matter.

The guitar amplifier according to the embodiment may employ a configuration which further includes a foot controller for inputting information indicating selection of the information set, information indicating ON of the performance mode, and information indicating OFF of the performance mode. When the foot controller is employed, selection of the solo mode and ON/OFF switching can be operated without using hands while playing the guitar.

The guitar amplifier according to the embodiment may employ a configuration in which the foot controller includes a plurality of buttons corresponding to each of the plurality of information sets, a button corresponding to a selected information set acts as a button which inputs information indicating ON or OFF of the performance mode to which the selected information set has been applied, and a button other than the button corresponding to the selected information set acts as a button which switches a corresponding information set to the selected information set when it is pressed in a state in which any of the plurality of information sets has been selected.

Figure 1:
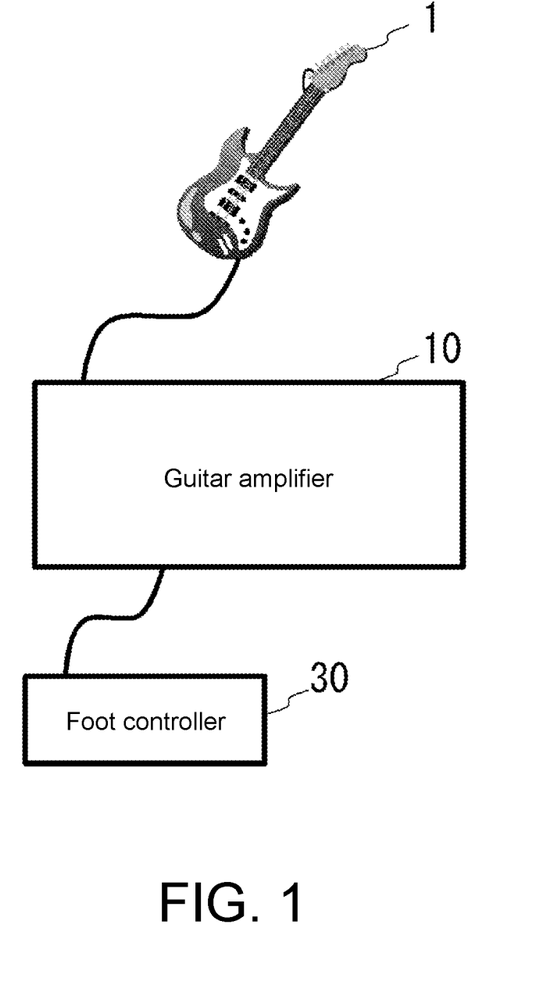
FIG. 1 shows a guitar amplifier according to an embodiment.

Hereinafter, embodiments will be described with reference to the drawings. Configurations of the embodiments are examples and the disclosure is not limited to the configurations of the embodiments. FIG. 1 illustrates a guitar amplifier according to an embodiment. A guitar amplifier 10 is connected to an electric guitar 1, performs musical sound processing for a musical sound of the electric guitar 1 that is input as an input musical sound to the guitar amplifier 10, amplifies it using a power amplifier, and then emits (outputs) a sound from a speaker.

The guitar amplifier 10 has an ON/OFF function of a solo (SOLO) function, and the guitar amplifier 10 can have different settings depending on whether the solo function is ON or OFF. When the solo function is ON, it is referred to as a solo mode. The solo mode is an example of a performance mode, but the performance mode is not limited to the solo mode. In the present embodiment, four information sets (referred to as patches) including one or two or more types of musical sound processing used when the solo mode is ON and set values for each of the types of musical sound processing can be registered in advance for the guitar amplifier 10. The number of patches that can be registered may be greater than or less than four. In the present embodiment, the patches include information on musical sound processing circuits each performing the one or two or more types of musical sound processing used in the solo mode and set values indicating ON/OFF of each of the musical sound processing circuits.

Figure 2:
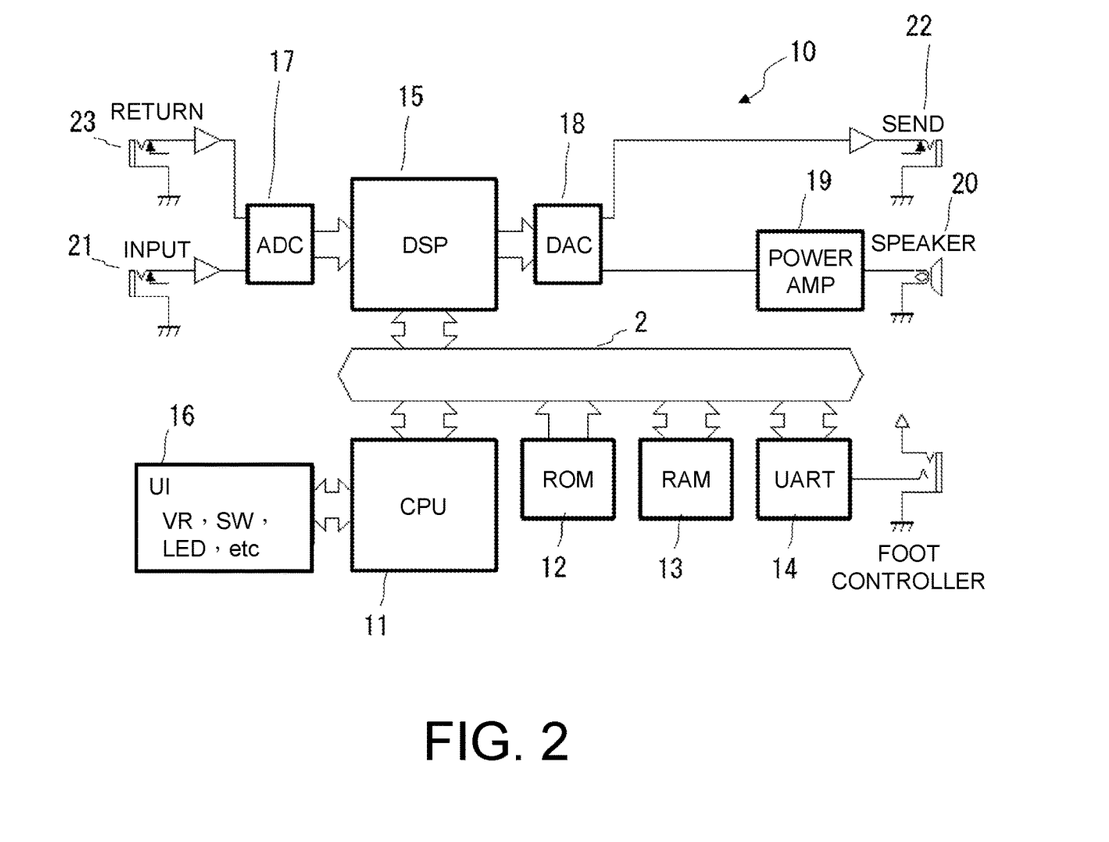
FIG. 2 shows a circuit configuration of the guitar amplifier.

FIG. 2 is a diagram showing a circuit configuration example of the guitar amplifier 10. In FIG. 2, the guitar amplifier 10 includes a central processing unit (CPU) 11 that controls the entire operation. The CPU 11 is connected to a read-only memory (ROM) 12, a random-access memory (RAM) 13, a universal asynchronous receiver/transmitter (UART) 14, and a digital signal processor (DSP) 15 via a bus 2. A user interface (UI) 16 is connected to the CPU 11.

The RAM 13 is used as a work area of the CPU 11 and a storage area of programs and data. The ROM 12 is used as a storage area of programs and data. The RAM 13 and the ROM 12 are examples of a storage device (storage medium) and store a plurality of information sets (information indicating patches) and the like. The UART 14 is used for communication with a foot controller 30.

The guitar amplifier 10 includes an input (INPUT) terminal 21, a send (SEND) terminal 22, and a return (RETURN) terminal 23. The electric guitar 1 is connected to the input terminal 21, and an electric signal (musical sound signal) generated by a performance of the electric guitar 1 is input to the input terminal 21. The send terminal 22 is a terminal for transmitting a musical sound signal to an external device (for example, an external effector), and the return terminal 23 is a terminal for inputting a musical sound signal output from an external device.

Musical sound signals input to the input terminal 21 and the return terminal 23 are analog-digital converted by an analog-to-digital converter (ADC) 17 and then input to the DSP 15. The DSP 15 performs control of pitching, filtering, amplifier processing, adding effects, or the like for a signal received from the electric guitar 1. A musical sound signal output from the DSP 15 is input to a digital-to-analog converter (DAC) 18 to be converted into an analog signal and sent to the send terminal 22 and a power amplifier 19. The power amplifier 19 amplifies the signal and connects it to a speaker 20, and the speaker 20 emits a musical sound corresponding to the musical sound signal.

The UI 16 includes an input device that inputs and sets a plurality of set values (parameters) for the guitar amplifier 10 such as knobs, switches, indicators (lamps, LEDs), buttons, and keys, and a display that displays a state and setting content of the guitar amplifier 10.

The CPU 11 performs processing of storing information related to a plurality of patches created using the UI 16 in the RAM 13, reception of a patch selection result and information indicating ON of the solo function (solo mode), and the like by executing a program. When ON of the solo mode is received, the CPU 11 performs processing for causing the DSP 15 to operate as a circuit group corresponding to the selected patch.

Figure 3A:
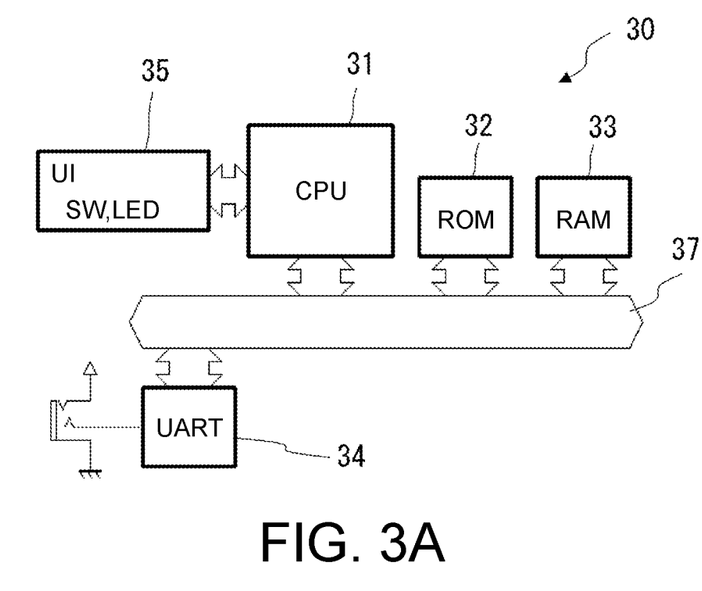
FIG. 3A and FIG. 3B show a circuit configuration of a foot controller.

FIG. 3A shows a circuit configuration example of the foot controller 30. The foot controller 30 includes a CPU 31, and a ROM 32, a RAM 33, and a UART 34 which are connected to the CPU 31 via a bus 37. The ROM 32 is used as a storage area of programs and data. The RAM 33 is used as a work area of the CPU 31 and a storage area of programs and data. The UART 34 is used for communication with the guitar amplifier 10 (main body). A UI 35 is connected to the CPU 31.

Figure 3B:
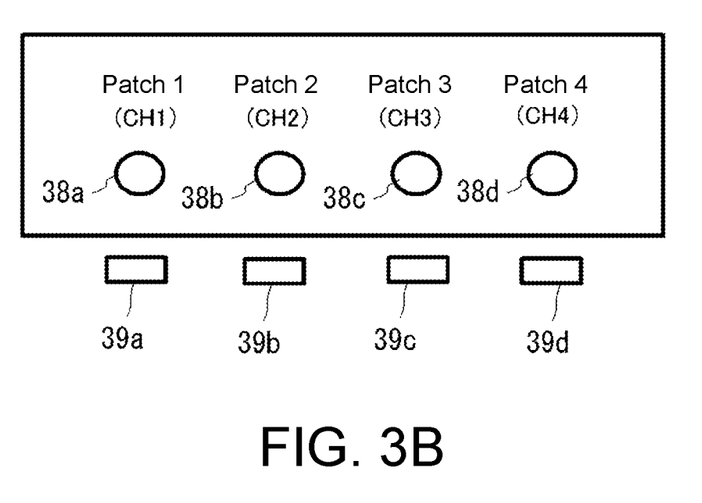

As shown in FIG. 3B, the UI 35 includes LEDs (examples of lamps) 38a to 38d prepared for each patch and foot switches (foot buttons) 39a to 39d prepared for each patch.

Figure 4:
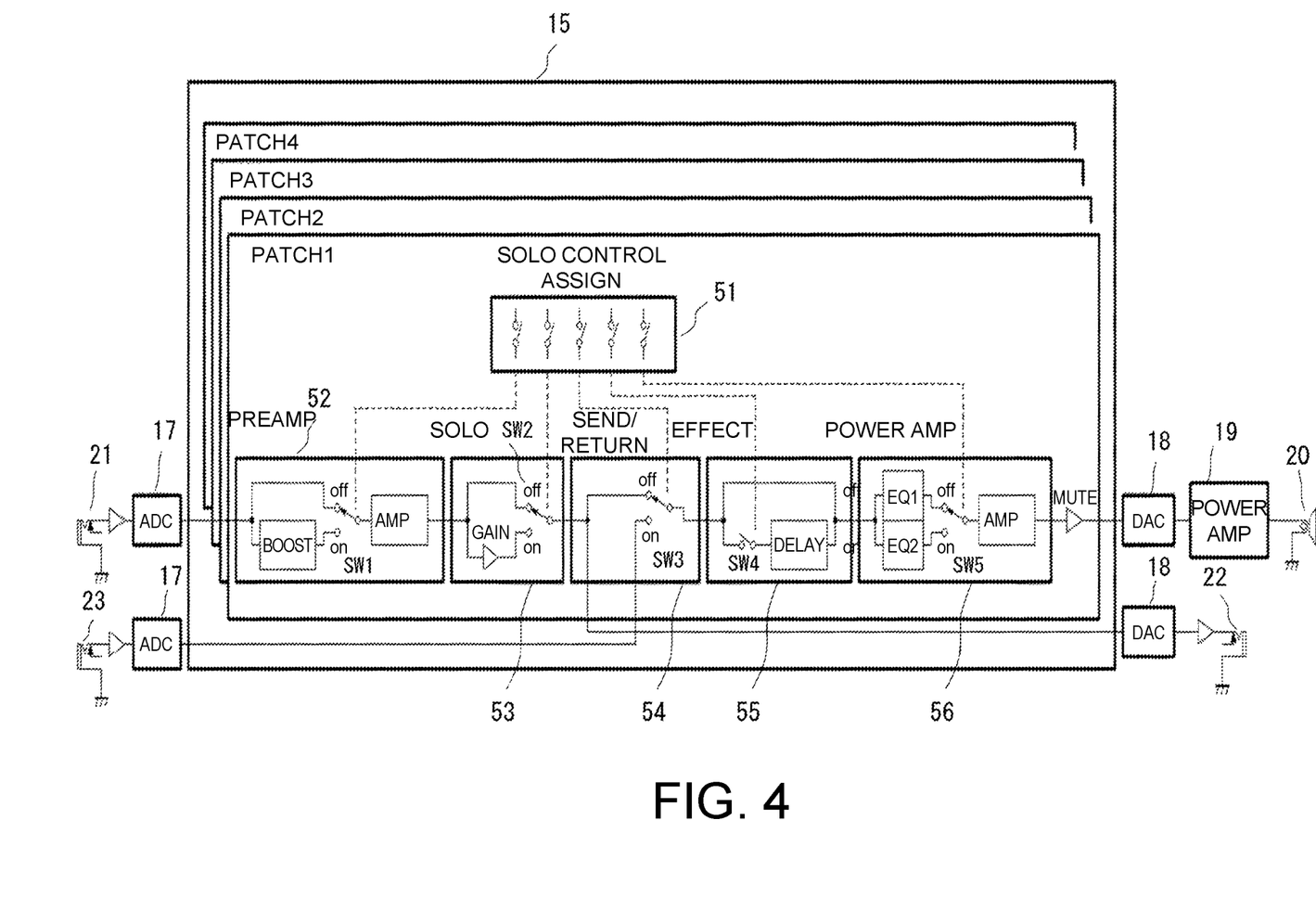
FIG. 4 is an explanatory diagram of a patch (PATCH).

FIG. 4 is an explanatory diagram of a patch. A patch 1 of patches 1 to 4 will be described as an example. The DSP 15 operates as a device that performs a plurality of types of musical sound processing, in other words, a device including a plurality of musical sound processing circuits, by executing a program. That is, the DSP 15 operates as each of the plurality of musical sound processing circuits by performing signal processing using an algorithm corresponding to the intended musical sound processing. Further, the musical sound processing circuits may also be configured by integrated circuits (FPGA, ASIC) other than the DSP 15 or digital and analog circuits. As an example of one or more musical sound processing circuits applied during the solo mode selected from the plurality of musical sound processing circuits that can be operated by the DSP 15, a preamplifier 52, a gain ON/OFF circuit 53 in the solo mode, a send/return control circuit 54, an effect circuit 55, and a power amplifier 56 (hereinafter, these may be collectively referred to as "musical sound processing circuits 52 to 56") are shown in FIG. 4. The DSP 15 can operate as a device including the musical sound processing circuits 52 to 56. An output of the power amplifier 56 is connected to the DAC 18, and then connected to the power amplifier 19 and the speaker 20.

The preamplifier 52 includes a path using a boost and a path not using the boost and can select ON/OFF of the boost by a selection switch SW1 of the paths. Also, the gain ON/OFF circuit 53 includes a path for increasing a gain during the solo mode and a path for not changing a gain and can select ON/OFF of the gain increase by a selection switch SW2 of the paths. Also, the send/return control circuit 54 includes a switch SW3 that selects ON/OFF for selection of a signal from the return terminal 23 and can select whether to use an external device. Also, the effect circuit 55 includes a path for adding effects (delay in the example of FIG. 4) and a path for not adding the effects and can select ON/OFF of effect addition by a switch SW4. The power amplifier 56 includes two types of equalizers and includes a switch SW5 for selecting one of them.

The patch contains information indicating one or more musical sound processing circuits (the preamplifier 52, the gain ON/OFF circuit 53, the send/return control circuit 54, the effect circuit (effector) 55, and the power amplifier 56 in the patch 1) applied during the solo mode, and information (referred to as a solo control instruction 51) indicating whether or not musical sound processing by the musical sound processing circuits 52 to 56 is necessary, that is, ON or OFF set values for each of the switches SW1 to SW5 included in the musical sound processing circuits 52 to 55. When the solo mode is turned on, ON/OFF control (ON or OFF setting) of the SW1 to SW5 is performed according to the ON or OFF set values for each of the musical sound processing circuits 52 to 56 indicated by the solo control instruction 51. Thereby, the DSP 15 is in a state in which it performs a circuit operation according to the patch 1. Types and the number of musical sound processing circuits and set values (ON or OFF of each of the musical sound processing circuits) indicated by the solo control instruction 51 can be made to have different content between the patches. Thereby, the guitar amplifier 10 is in a state of having a plurality of settings of the musical sound processing circuit in the solo mode. Configurations of the musical sound processing circuits applied to the solo mode can be easily changed by changing the patches. The solo control instruction 51 is an example of the "set value for each of one or two or more types of musical sound processing used in the performance mode."

Figure 5:
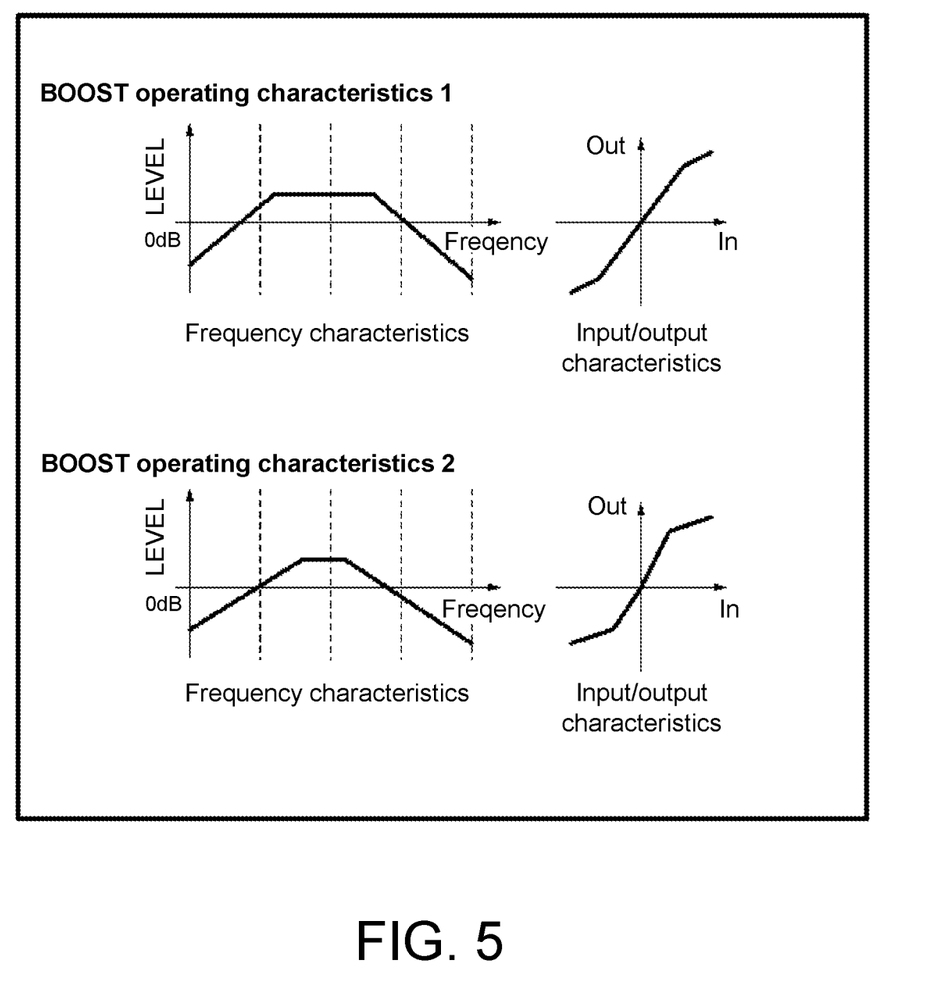
FIG. 5 shows an example of operating characteristics of a boost.

Also, as shown in FIG. 5, a boost of the preamplifier 52 can have a plurality of types of operating characteristics. One operating characteristic can be assigned to one patch, and different operating characteristics can be assigned between the patches. Thereby, a plurality of patches with different boost operating characteristics can be registered in the RAM 13.

Figure 6:
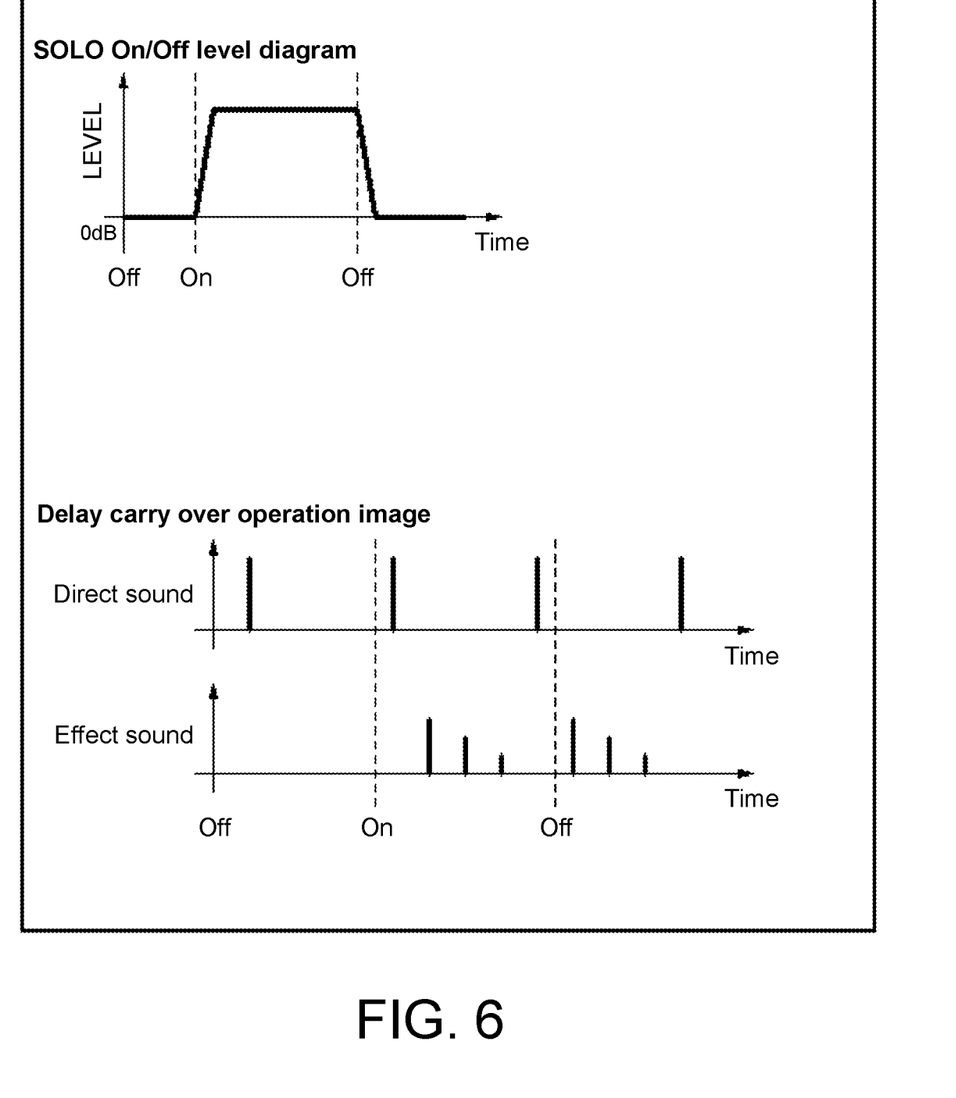
FIG. 6 is an explanatory diagram of a gain change and an effector (delay) according to ON/OFF of a solo (SOLO) function.

FIG. 6 is a diagram showing increase and decrease of a level according to ON/OFF of a gain of the ON/OFF circuit 53. In this way, a gain can be increased in the solo mode. Also, an effect of the effects (delay) is shown in FIG. 6. A state in which an acoustic echo is output in accordance with an input of an original sound (direct sound) is shown.

Figure 7:
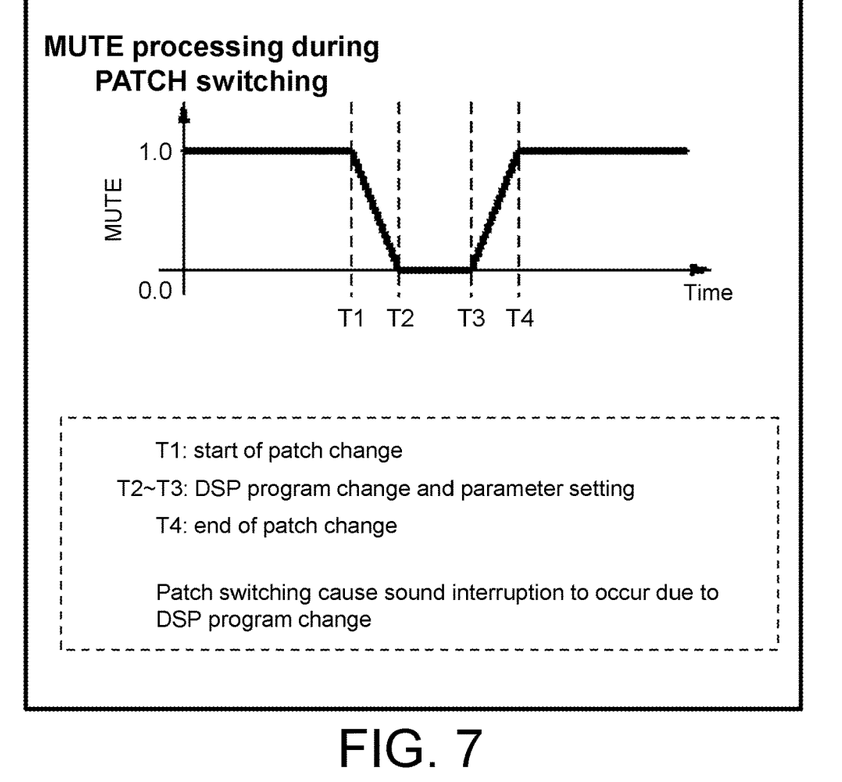
FIG. 7 is a diagram explaining a mute operation at the time of patch switching.

FIG. 7 shows mute processing at the time of patch switching. As shown in FIG. 7, when a patch change is started at T1, a mute level becomes to 0 in the period to T2, and the mute is 0, that is, the mute state is maintained during a time of changing DSP programs and setting parameters. Thereafter, when the DSP program change and the parameter setting end, the mute level returns to 1 from T3 to T4. In this way, for abnormal noise generated due to the DSP program change and the parameter setting accompanied by changing of the patches, the abnormal noise is prevented from being emitted to the outside by applying mute.

Figure 8:
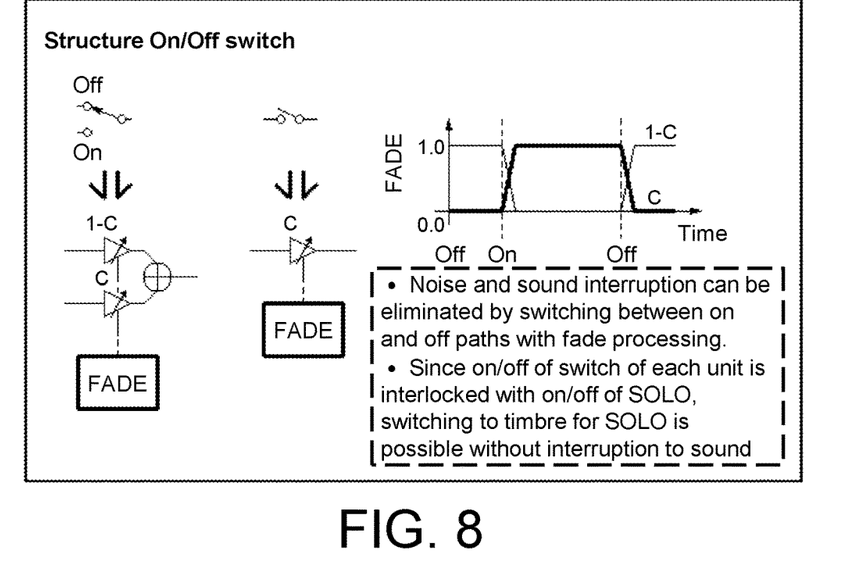
FIG. 8 shows a structure of ON/OFF of a switch.

As shown in FIG. 8, when the switches SW1 to SW5 are changed between ON and OFF, an interruption to the sound can be eliminated by switching between the ON and OFF paths with fade processing. As described above, ON/OFF of the switches SW1 to SW5 is interlocked with ON/OFF of the solo mode. Thereby, a change to a timbre for the solo mode is possible without an interruption to the sound.

Figure 9A:
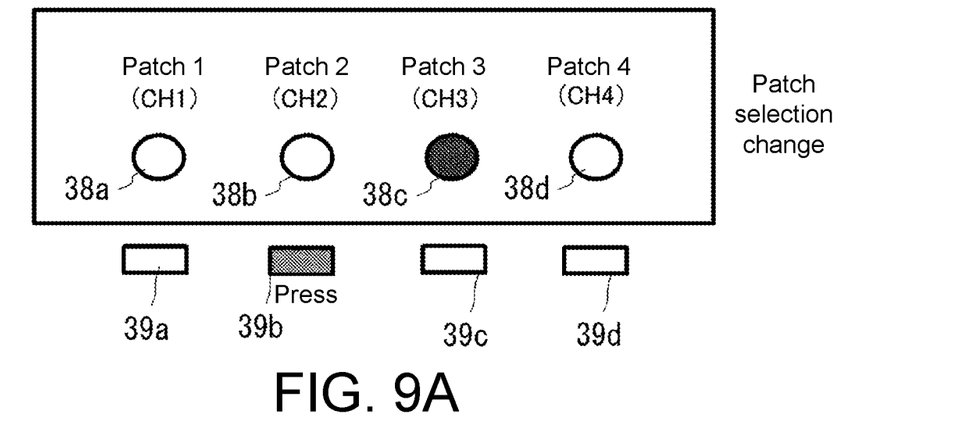
FIGS. 9A, 9B and 9C are explanatory views of an operation using the foot controller.

FIGS. 9A, 9B, and 9C are explanatory diagrams of an operation of the foot controller 30. In FIG. 9A, the LED 38c corresponding to the patch 3 (channel (CH) 3) is turned on. In this state, when a user wants to change it to the patch 2, the user presses the foot switch 39b corresponding to the patch 2. Information indicating such a change to the patch 2 is sent to the guitar amplifier 10, and the CPU 11 of the guitar amplifier 10 receives the information as a change instruction to select the patch 2 that is different from the patch 3 and changes a selected patch from the patch 3 to the patch 2.

Figure 9B:
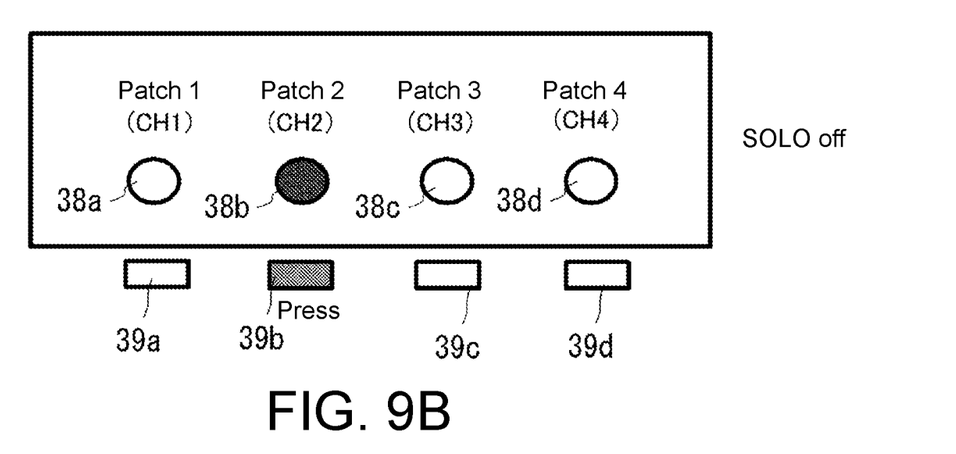
Figure 9C:
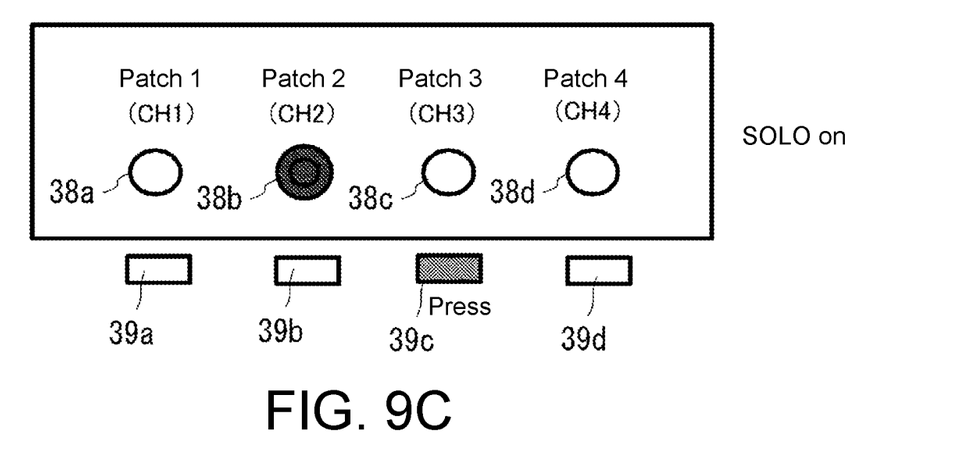

When the change from the patch 3 to the patch 2 ends, information indicating the same is sent to the foot controller 30. Then, the LED 38c is turned off and the LED 38b corresponding to the patch 2 is turned on as shown in FIG. 9B by, for example, control of the CPU 31. In this state, it is assumed that the foot switch 39b corresponding to the patch 2 is pressed. Then, information indicating that the foot switch 39b has been pressed is transmitted to the guitar amplifier 10. The CPU 11 of the guitar amplifier 10 receives this information as an ON signal of the solo mode (request to turn on the solo mode: information indicating ON of the solo mode), performs ON/OFF settings of the switches SW1 to SW5 based on the solo control instruction 51 of the patch 2, and causes the DSP 15 to perform musical sound control with a circuit configuration according to the patch 2. As shown in FIG. 9C, when the solo mode is ON, the LED 38b blinks due to the control of the CPU 31 to indicate that it is in the solo mode to which the patch 2 is applied. Further, the LED 38b may be turned on in a color or color temperature different from that at the time of the selection instead of blinking. Further, when the foot switch 39b is pressed from the state shown in FIG. 9C, information indicating that the foot switch 39b has been pressed is transmitted to the guitar amplifier 10. The CPU 11 of the guitar amplifier 10 receives this information as an OFF signal of the solo mode (request to turn off the solo mode: information indicating OFF of the solo mode), and performs setting of turning off the switches SW1 to SW5 regardless of the solo control instruction 51 of the patch 2. Thereafter, information indicating OFF is sent to the foot controller 30, and the LED 38b is turned on (as shown in FIG. 9B) indicating OFF by the control of the CPU 31.

Figure 10:
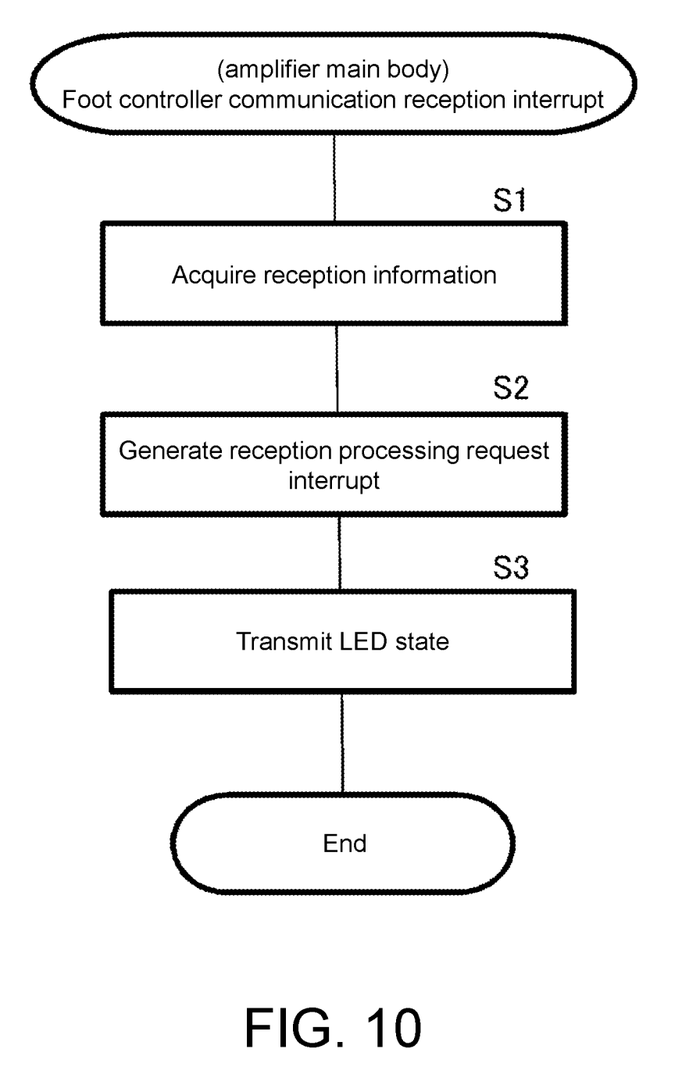
FIG. 10 is a flowchart showing a processing example of a guitar amplifier main body.
Figure 11:
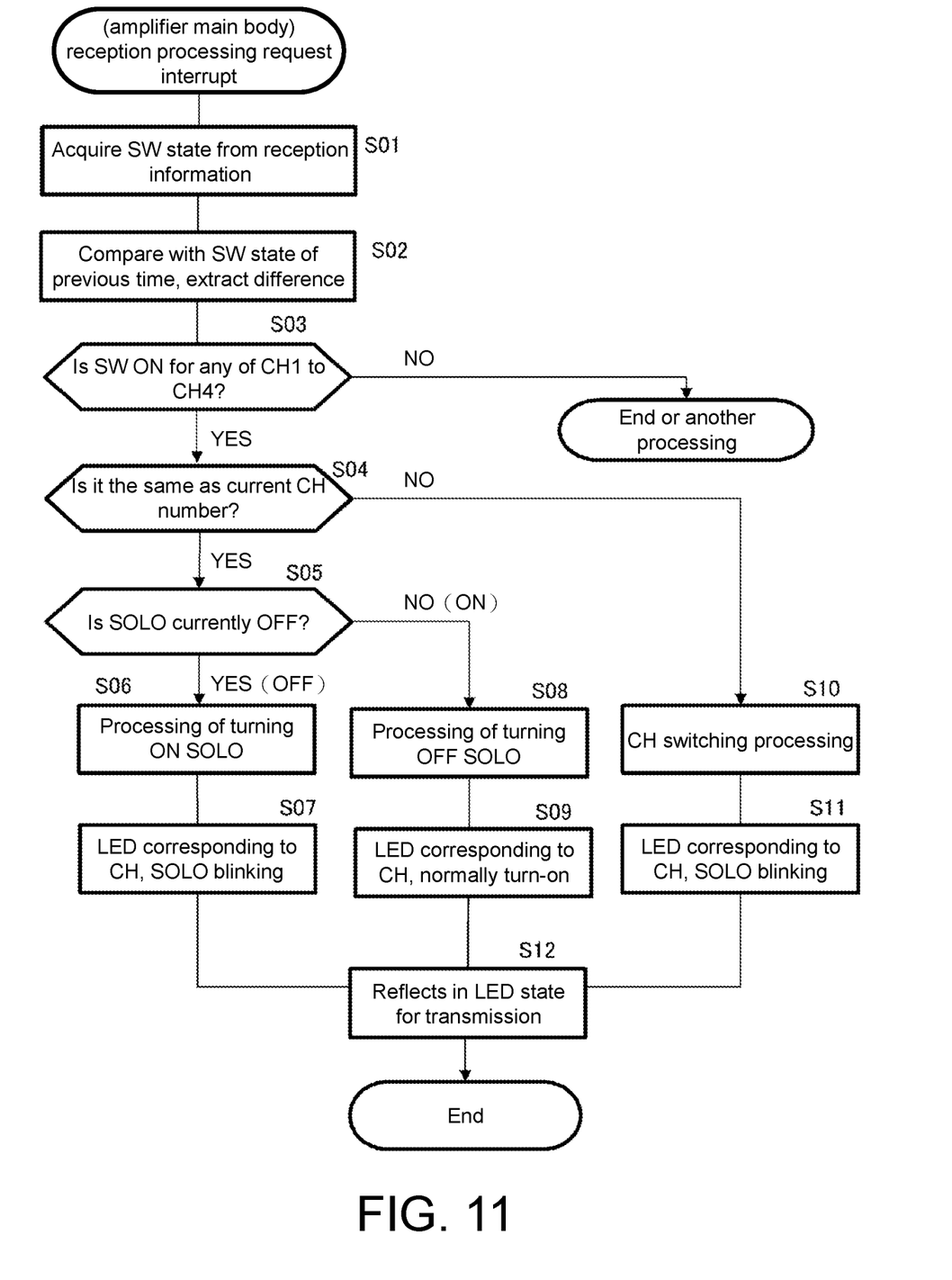
FIG. 11 is a flowchart showing a processing example of the guitar amplifier main body.

FIGS. 10 and 11 are flowcharts showing a processing example of the CPU 11 of the guitar amplifier 10. In FIG. 10, in step S1, the CPU 11 acquires reception information from the foot controller 30. In step S2, the CPU 11 generates a reception processing request interrupt. In step S3, the CPU 11 transmits an LED state to the foot controller 30. The LED state is information indicating ON/OFF states of the LEDs 38a to 38d.

FIG. 11 shows processing of the reception processing request interrupt. In step S01, the CPU 11 acquires a switch (SW) state included in the reception information acquired in step S1. The SW state indicates states of the foot switches 39a to 39d, that is, ON/OFF states thereof.

In step S02, the CPU 11 compares a current SW state with a previous SW state and extracts a difference therebetween. In step S03, it is determined whether or not a switch is ON for any of the patches 1 to 4 (CH1 to CH4) (whether any of the foot switches 39a to 39d is ON). When NO is determined in step S03, this interrupt processing ends or other processing is performed.

When YES is determined in step S03, the CPU 11 determines whether or not the CH number in which the switch is in an ON state is the same as the CH number of the currently selected patch (step S04). When it is determined to be the same as the currently selected CH number, the processing proceeds to step S05, and otherwise, the processing proceeds to step S10.

In step S05, the CPU 11 determines whether or not the solo mode is currently OFF. When the solo mode is determined to be OFF, the CPU 11 causes the processing to proceed to step S06, and otherwise, causes the processing to proceed to step S08.

In step S06, the CPU 11 performs processing of turning on the solo mode. At this time, the CPU 11 constructs a circuit for the solo mode in the DSP 15 according to ON/OFF settings of the switches SW1 to SW5 indicated by the solo control instruction 51 of the patch of the currently selected CH number.

In step S07, the CPU 11 decides to cause an LED corresponding to the currently selected CH number to blink and reflects it in the LED state for transmission (step S12). Thereby, the LED corresponding to the patch applied to the solo mode blinks in the foot controller 30.

In step S08, the CPU 11 performs processing of turning off the solo mode. Due to the OFF processing, the switches SW1 to SW5 in each of the musical sound processing circuits 52 to 56 are turned off regardless of set values of the solo control instruction 51 (an example of "predetermined setting").

In step S09, the CPU 11 decides to turn on the LED corresponding to the currently selected CH number in a normal state and reflects it in the LED state for transmission (step S12). Thereby, the LED corresponding to the patch applied to the solo mode is turned on in the foot controller 30.

In step S10, the CPU 11 performs patch (CH) switching processing in a state in which the solo mode is ON. That is, the patch applied to the solo mode is changed and performs change of the DSP program and the parameters.

In step S11, the CPU 11 decides to cause an LED corresponding to the changed patch to blink and reflects it in the LED state for transmission. Thereby, the LED corresponding to the changed patch applied to the solo mode blinks in the foot controller 30.

Figure 12:
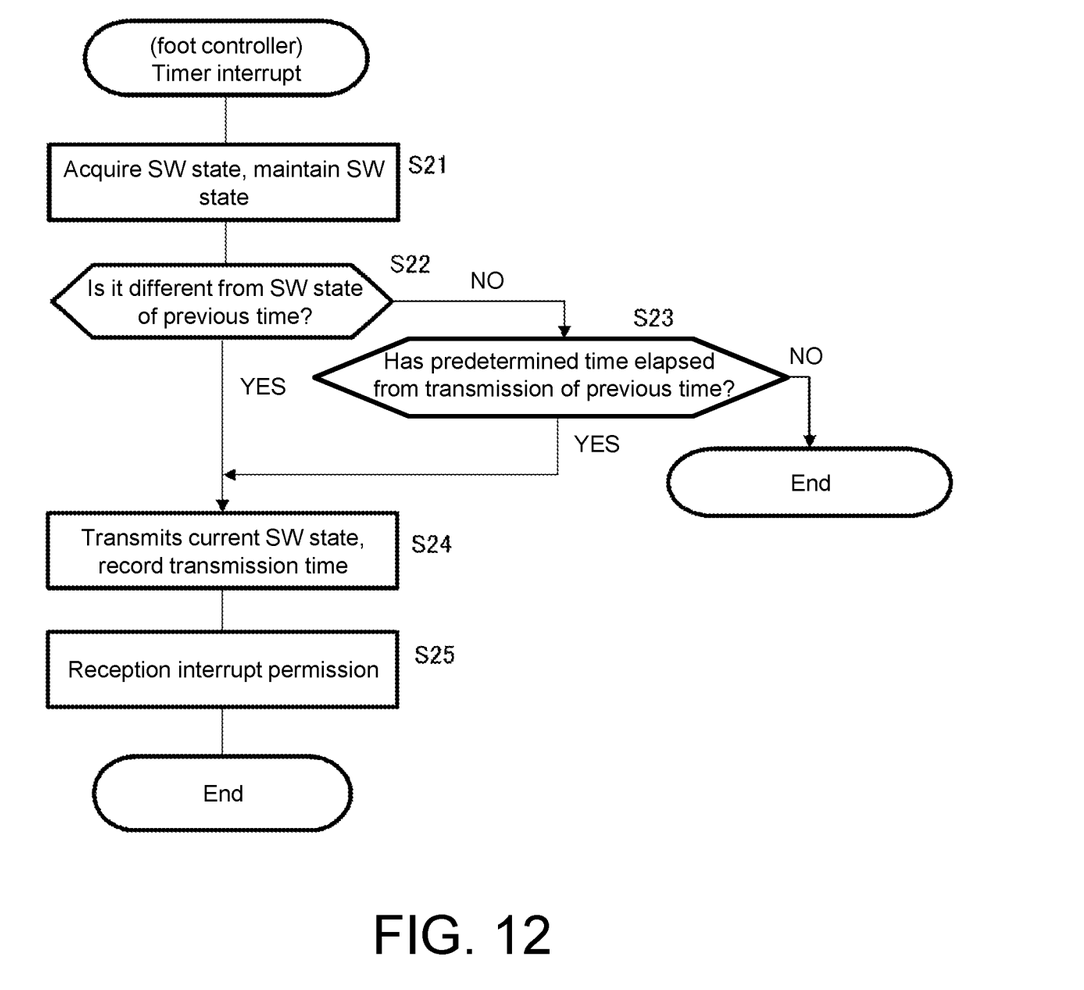
FIG. 12 is a flowchart showing a processing example of the foot controller.
Figure 13:
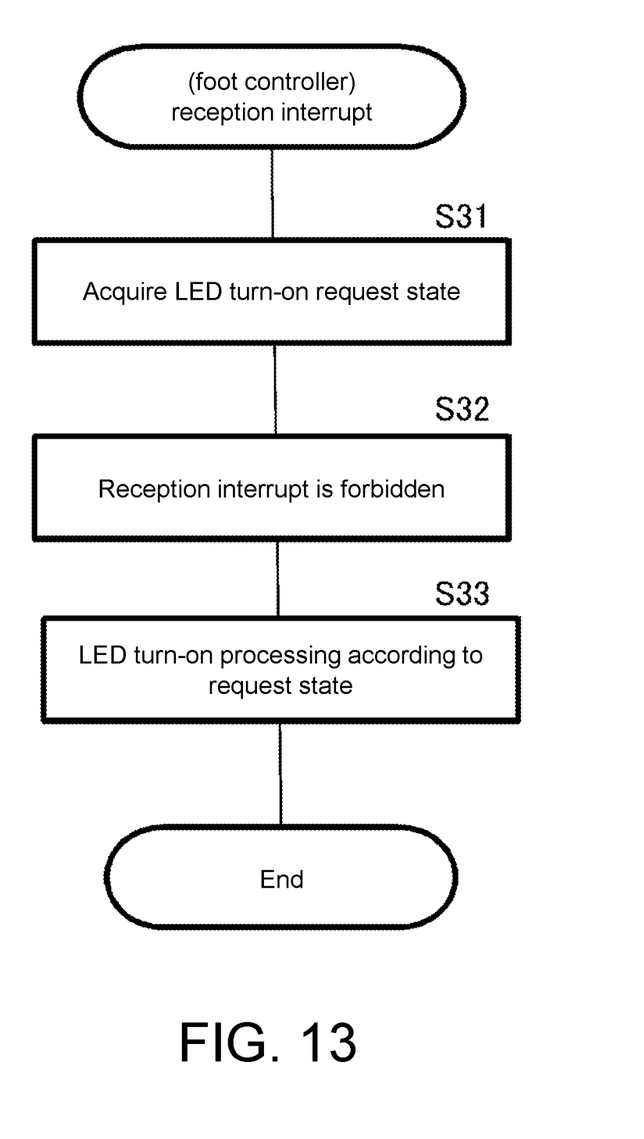
FIG. 13 is a flowchart showing a processing example of the foot controller.

FIGS. 12 and 13 show a processing example in the foot controller 30. In step S21, the CPU 11 acquires a current SW state (ON/OFF of the foot switches 39a to 39d) and stores the SW state in the RAM 33.

In step S22, the CPU 31 compares the SW state obtained in step S21 with a previously stored SW state and determines whether there is a difference. When it is determined that there is a difference, the processing proceeds to step S24, and otherwise, the process proceeds to step S23. In step S23, the CPU 31 determines whether or not a predetermined time has elapsed from a previous transmission. When it is determined that the predetermined time has elapsed, the CPU 31 causes the processing to proceed to step S24, and otherwise, ends the processing.

In step S24, the CPU 31 transmits the current SW state to the guitar amplifier 10 and records a transmission time thereof in the RAM 33. In step S25, the CPU 31 sets the reception interrupt in a permission state.

FIG. 13 shows a processing example of the reception interrupt performed in the permission state. In step S31, the CPU 31 acquires an LED turn-on request state from the guitar amplifier 10. In step S32, the CPU 31 sets the reception interrupt in a forbidden state. In step S33, the CPU 31 performs LED turn-on processing according to the LED turn-on request state. Thereby, processing of turning on, turning off, and blinking the LEDs 38a to 39d according to the LED turn-on request state is performed.

According to the embodiment, since ON/OFF of the switches SW1 to SW5 defined in the patches is interlocked with ON or OFF of the solo mode, a circuit configuration applied to the solo mode can be easily constructed. Since there is no change in an algorithm for realizing the musical sound processing circuit of the DSP at the time of ON/OFF switching of the solo mode, an interruption to the sound can be prevented. Also, since a plurality of patches is stored, the patches can be easily switched to change content of the control for musical sounds of the guitar amplifier 10. Also, since turning-on of the solo mode and selection of the patches can be performed using the foot switch, a guitarist can easily operate the patch selection of the solo mode and ON/OFF switching of the solo mode even while playing. The configuration described in the embodiment can be appropriately combined within a range not deviating from the purpose.

What is claimed is:

1. A guitar amplifier which performs musical sound processing on an input musical sound and outputs it, has a plurality of information sets, has an ON/OFF function of a performance mode for each of the plurality of information sets, and has different settings depending on whether the performance mode is ON or OFF, the guitar amplifier comprising:

a storage which stores the plurality of information sets, wherein each of the plurality of information sets includes a set value for each of one or two or more types of musical sound processing used in the performance mode; and a controller which changes the setting of the one or two or more types of musical sound processing to a setting according to a set value of a selected information set when information indicating ON of the performance mode, to which the selected information set from the plurality of information sets has been used, is input, wherein when information indicating OFF of the performance mode is input, the controller changes the setting of the one or two or more types of musical sound processing to a predetermined setting regardless of the set value of the selected information set, and changes the setting of at least one type of musical sound processing to select one of two types of operations.

2. The guitar amplifier according to claim 1, wherein the set value contained in the information set indicates whether or not the one or two or more types of musical sound processing are necessary.

3. The guitar amplifier according to claim 2, wherein whether or not the one or two or more types of musical sound processing are necessary is one or more selected from whether or not utilizing a boost is necessary, whether or not changing a gain according to ON/OFF of the performance mode is necessary, whether or not utilizing an external device is necessary, whether or not adding effects using an effector is necessary, whether or not utilizing an equalizer is necessary, and whether or not changing a volume is necessary.

4. The guitar amplifier according to claim 1, wherein the controller performs fade processing at the time of switching a signal path of the musical sound processing according to switching of the information set applied to the performance mode.

5. The guitar amplifier according to claim wherein the controller receives an input of information indicating selection of the same information set as a selected information set as information indicating ON or OFF of the performance mode to which the selected information set has been applied, and receives an input of information indicating selection of an information set different from the selected information set as a change instruction to select the different information set in a state in which any of the plurality of information sets has been selected.

6. The guitar amplifier according to claim 5, wherein the controller changes the setting of the one or two or more types of musical sound processing used in the performance mode on the basis of a set value contained in the different information set when an input of information indicating selection of an information set different from the selected information set is received as a change instruction to select the different information set in a state in which any of the plurality of information sets has been selected.

7. The guitar amplifier according to claim 6, wherein the controller performs mute processing when the setting of the one or two or more types of musical sound processing is changed.

8. The guitar amplifier according to claim 6, wherein the one or two or more types of musical sound processing are one or more arbitrarily selected from boosting, gaining, utilizing an external device, adding effects by an effector, equalizing, and changing a volume.

9. The guitar amplifier according to claim 1, further comprising a foot controller for inputting information indicating selection of the information set, information indicating ON of the performance mode, and information indicating OFF of the performance mode.

10. The guitar amplifier according to claim 9, wherein the foot controller includes a plurality of buttons corresponding to each of the plurality of information sets, a button corresponding to a selected information set acts as a button which inputs information indicating ON or OFF of the performance mode to which the selected information set has been applied, and a button other than the button corresponding to the selected information set acts as a button which switches a corresponding information set to the selected information set when it is pressed in a state in which any of the plurality of information sets has been selected.

11. A control method of a guitar amplifier in which musical sound processing on an input musical sound is performed and output, the guitar amplifier having a plurality of information sets, having an ON/OFF function of a performance mode for each of the plurality of information sets, and having different settings depending on whether the performance mode is ON or OFF, the control method of a guitar amplifier comprising:

storing the plurality of information sets, wherein each of the plurality of information sets includes a set value for each of one or two or more types of musical sound processing used in a performance mode;

changing the setting of the one or two or more types of musical sound processing to a setting according to a set value of a selected information set when information indicating ON of the performance mode, to which the selected information set from the plurality of information sets has been used, is input; and when information indicating OFF of the performance mode is input, changing the setting of the one or two or more types of musical sound processing to a predetermined setting regardless of the set value of the selected information set, and changing the setting of at least one type of musical sound processing to select one of two types of operations.

12. The control method of a guitar amplifier according to claim 11, wherein the set value contained in the information set indicates whether or not the one or two or more types of musical sound processing are necessary.

13. The control method of a guitar amplifier according to claim 12, wherein whether or not the one or two or more types of musical sound processing are necessary is one or more selected from whether or not utilizing a boost is necessary, whether or not changing a gain according to ON/OFF of the performance mode is necessary, whether or not utilizing an external device is necessary, whether or not adding effects using an effector is necessary, whether or not utilizing an equalizer is necessary, and whether or not changing a volume is necessary.

14. The control method of a guitar amplifier according to claim 11, further comprising:
    performing fade processing at the time of switching a signal path of the musical sound processing according to switching of the information set applied to the performance mode.

15. The control method of a guitar amplifier according to claim 11, further comprising:
    receiving an input of information indicating selection of the same information set as a selected information set as information indicating ON or OFF of the performance mode to which the selected information set has been applied, and
    receiving an input of information indicating selection of an information set different from the selected information set as a change instruction to select the different information set in a state in which any of the plurality of information sets has been selected.

16. The control method of a guitar amplifier according to claim 15, further comprising:
    changing the setting of the one or two or more types of musical sound processing used in the performance mode on the basis of a set value contained in the different information set when an input of information indicating selection of an information set different from the selected information set is received as a change instruction to select the different information set in a state in which any of the plurality of information sets has been selected.

17. The control method of a guitar amplifier according to claim 16, further comprising:
    performing mute processing when the setting of the one or two or more types of musical sound processing is changed.

18. The control method of a guitar amplifier according to claim 16, wherein the one or two or more types of musical sound processing are one or more arbitrarily selected from boosting, gaining, utilizing an external device, adding effects by an effector, equalizing, and changing a volume.

* * * * *